United States Patent
Gaillard et al.

(10) Patent No.: US 8,011,091 B2
(45) Date of Patent: Sep. 6, 2011

(54) FABRICATION METHOD OF A NANOTUBE-BASED ELECTRIC CONNECTION HAVING AIR GAPS

(75) Inventors: Frederic-Xavier Gaillard, Voiron (FR); Jean-Christophe Coiffic, Grenoble (FR)

(73) Assignee: Commissariat à l'Energie Atomique, Paris (FR)

( * ) Notice: Subject to any disclaimer, the term of this patent is extended or adjusted under 35 U.S.C. 154(b) by 522 days.

(21) Appl. No.: 12/216,614

(22) Filed: Jul. 8, 2008

(65) Prior Publication Data

US 2009/0019690 A1 Jan. 22, 2009

(30) Foreign Application Priority Data

Jul. 17, 2007 (FR) .................................. 07 05153

(51) Int. Cl.
*H01R 43/00* (2006.01)
*H05K 3/00* (2006.01)
(52) U.S. Cl. ............................ 29/850; 174/257; 174/262
(58) Field of Classification Search .................... 29/846, 29/847, 850, 852; 174/257, 261, 262; 361/748
See application file for complete search history.

(56) References Cited

U.S. PATENT DOCUMENTS 6,297,063 B1 * 10/2001 Brown et al. ..................... 438/2
7,172,980 B2    2/2007 Torres et al.
2003/0179559 A1 * 9/2003 Engelhardt et al. ........... 361/780

OTHER PUBLICATIONS

M. Nihei et al., Electrical Properties of Carbon Nanotube Bundles for Future Via Interconnects, Japanese Journal of Applied Physics, 2005, pp. 1626-1628, vol. 44, No. 4A, Japan.
L.G. Gosset et al., General Review of Issues and Perspectives for Advanced Copper Interconnections Using Air Gap as Ultra-low K Material, IEEE, 2003, pp. 65-67.
R. Hoofman et al., Benefits and Trade-Offs in Multi-Level Air Gap Integration, Materials Research Society, 2006, vol. 914.

* cited by examiner

*Primary Examiner* — Livius R Cazan
(74) *Attorney, Agent, or Firm* — Oliff & Berridge, PLC

(57) ABSTRACT

A target layer with holes is formed on a bottom conducting layer. Nanotubes are formed in the holes from the bottom conducting layer. A flat insulating layer is then deposited on the target layer, the nanotubes passing through the insulating layer. Air gaps are then formed by selective decomposition of the target layer. The decomposition agent and/or decomposition by-products use the walls and the central holes of the nanotubes to pass between the target layer and the outside. After decomposition, the top conducting layer is formed on the insulating layer. The nanotubes then electrically connect the conducting layers.

10 Claims, 3 Drawing Sheets

FABRICATION METHOD OF A NANOTUBE-BASED ELECTRIC CONNECTION HAVING AIR GAPS

BACKGROUND OF THE INVENTION

The invention relates to a fabrication method of a nanotube-based electric connection between two conducting layers, respectively bottom and top, separated by a target layer, a method successively comprising:
- formation of the target layer on the bottom conducting layer,
- formation in the target layer of at least one hole comprising a bottom,
- growth of the nanotubes in said hole,
- formation of the top conducting layer electrically connected to the bottom conducting layer by the nanotubes,

STATE OF THE ART

Nowadays, integrated electronic circuitry presents a non-negligible proportion of metallic elements. The latter can be used as interconnect elements, antennas, coils or induction coils. With the reduction of the distances separating the metallic layers, electrostatic or electromagnetic couplings between these elements are increasing, which has the effect of modifying their electrical behavior. In general manner, these electrostatic couplings are modeled by the appearance of at least one stray capacitance between the metallic elements. Reducing the coupling involves decreasing the dielectric constant k of the material located between the metallic elements.

For current generations of integrated circuits, the use of low-k dielectric materials (about 2.3 to 2.7) is compatible with the performances sought for. These low-k dielectric materials advantageously replace silicon oxides.

However, for the forthcoming technological generations (nodes smaller than 32 nm), the performance requirements are considerably greater than the small improvement of permittivity currently measured on deposited bulk materials. The use of air gaps in the interconnect structures today seems inevitable. With such architectures, the air gaps present between the conductor lines achieve k values equal to 1.

At the present time, a possible direction for fabrication of these gaps is the use of non-conformal deposition of dielectric material on interline layers of metallic material. This approach, described by Gosset et al. ("General review of issues and perspectives for advanced copper interconnections using air gap as ultra-low K material", Proceedings of the IEEE, 2003, International Interconnect Technology Conference (2003) 65), enables the required gaps to be obtained under certain fabrication conditions and with a surplus of complex and costly technological steps.

Another envisaged solution consists in integrating a sacrificial material between the patterns of metallic material thereby forming the intermetal level. This material reacts after integration by means of various physico-chemical processes (for example by thermal annealing, UV radiation treatment ("Benefits and Trade-offs in Multi-Level Air Gap Integration", Spring MRS San Diego, April 2006), or chemical etching (U.S. Pat. No. 7,172,980). It is thereby possible to perform all or part of integration of the interconnect levels with the sacrificial material, and to then form the air gaps. However, this approach does greatly limit the range of materials able to be used in integration. The sacrificial material, which has to leave room for the gap, does in fact have to be compatible with semiconductor technology, be decomposable and, like its removal, the physico-chemical processes used must not damage the electronic devices that have already been integrated (CMOS transistors, capacitors . . . ). Likewise, the materials adjacent to the sacrificial material have to be able to withstand these physico-chemical processes so as not to be impaired, but certain of these materials have to allow decomposition and removal of the sacrificial material by being for example permeable to the multiple chemical processes.

Carbon nanotubes are currently the subject of extensive research efforts as their monoatomic cylindrical structure gives them exceptional properties on the nanometric scale. A promising application consists in using nanotubes in interconnects, in particular in the microelectronics industry, as described by Nihei et al. ("Electrical Properties of Carbon nanotube Bundles for Future Via Interconnects" Japanese Journal of Applied Physics Vol. 44 No 4A, 2005 pp 1626-1628). These interconnects are formed by two lines of conducting metal, at present made of copper, situated above one another, thus forming two metallic levels connected by conducting bridges called vias.

To withstand the stresses imposed by the reduction of size added to complexification of the integration parameters, it is envisaged to use carbon nanotubes as nanometric metallic wires for the interconnects. The latter do in fact possess very interesting intrinsic properties compared with copper. Integration of carbon nanotubes in a microelectronics interconnect is described in the document US-A-2003/0179559, in which the nanotubes connect two layers of conducting materials.

OBJECT OF THE INVENTION

The object of the invention is to provide a method aiming to palliate the above-mentioned shortcomings, more particularly a fabrication method that is less complex and less costly.

According to the invention, this object is achieved by the fact that, between growth of the nanotubes and formation of the top conducting layer, the method comprises
- deposition of a flat insulating layer through which the nanotubes pass,
- selective decomposition of the target layer, made of decomposable material, the nanotubes with porous walls forming passages between the target layer and the outside for a decomposition agent and/or decomposition by-products formed during said selective decomposition.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS OF THE INVENTION

Figure 1:
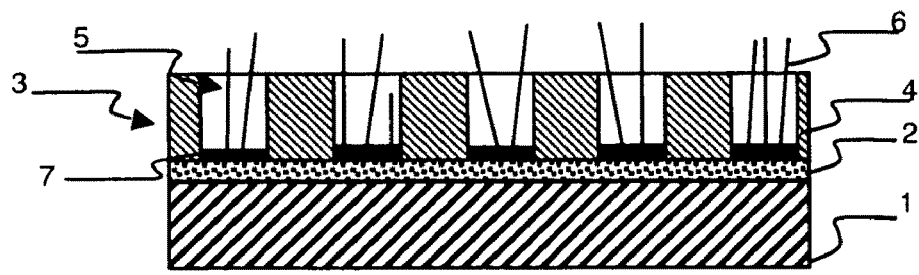
FIGS. 1 to 4 represent the successive steps of a first embodiment of the method according to the invention.

In a first embodiment illustrated in FIG. 1, a target layer 3 is made on a bottom conducting layer 2, itself deposited on a substrate 1. In this particular embodiment, target layer 3 is solely composed of a decomposable material 4. Target layer 3 can however be formed from several decomposable materials having different decomposition agents and may contain at least one non-decomposable material. Decomposable material 4 is for example silicon dioxide ($SiO_2$) which can be decomposed by chemical etching, or a thermally decomposable polymer such as polymethylmethacrylate or alpha-terpinene. Patterning of target layer 3 is then performed by any suitable technique, for example by photolithography and etching to form holes 5. The bottom of hole 5 is thereby formed by predefined free zones of bottom conducting layer 2. The side walls of holes 5 are formed by decomposable material 4.

Nanotubes 6 are then formed, from bottom conducting layer 2, inside holes 5, by any known method for example by catalytic means, high-temperature electrical discharge or laser ablation. Nanotubes 6 then present one end in contact with bottom conducting layer 2.

As illustrated in FIG. 1, a layer of catalyst 7 enabling growth of nanotubes 6 is advantageously formed in the bottom of holes 5. Catalyst 7 is for example made from Co, Ni, Fe, Al, $Al_2O_3$, $Fe_2O_3$, or Mo. It can also be achieved by self-positioned deposition and is then for example made from CoWP, CoWP/B, NiMoP, NiMoB, their oxides or their alloys. Catalyst 7 can be deposited in the form of clusters or be composed of multi-layers of different catalysts. In certain cases, catalyst 7 can be preceded by deposition of a barrier layer and/or of an adhesion layer in the bottom of holes 5.

Nanotubes 6 are for example carbon nanotubes and are preferably of hollow cylindrical shape. Nanotubes 6 are not necessarily strictly vertical and can also be bent. Most of nanotubes 6 are substantially perpendicular to the surface of substrate 1 on which they are formed.

In the case of carbon nanotubes 6, growth of the nanotubes can be performed by any suitable technique, for example by chemical vapor deposition CVD, plasma enhanced chemical vapor deposition PECVD, electron cyclotron resonance PECVD, hot-filament chemical vapor deposition, laser-assisted chemical vapor deposition, etc. A technique enabling growth of carbon nanotubes 6 from a catalyst and at a temperature of less than 900° C. is preferably used. The gases used in formation of carbon nanotubes can be CO, $C_2H_2$, $CH_4$, $Fe(C_5H_5)_2$, xylene, metallocenes, alcohols in gaseous state and all carbonaceous gases, $H_2$, $NH_3$, $H_2O$, $O_2$ or a mixture of these gases. The carbon can also be input by means of a graphite sole bombarded by a plasma.

Figure 2:
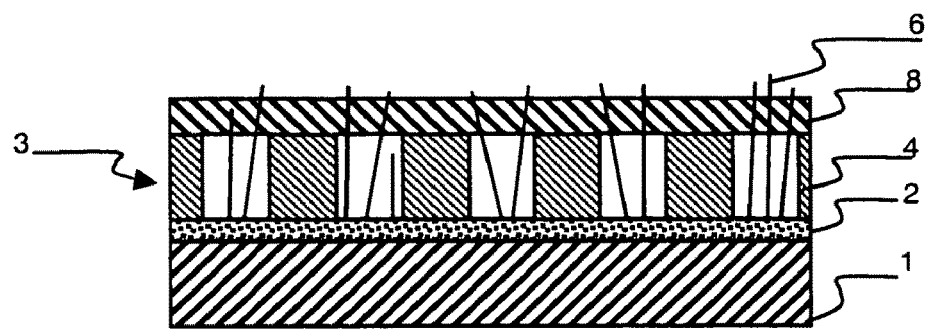

As illustrated in FIG. 2, a substantially flat insulating layer 8 is then deposited on target layer 3 and nanotubes 6. Deposition of insulating layer 8 is advantageously of non-conformal type. In this way, layer 8 does not completely coat the patterns in target layer 3 and nanotubes 6 but forms a substantially horizontal and uniform continuous film thus forming air gaps filling holes 5. The deposition method of layer 8 is conventional as it is commonly used to form insulating layers in interconnect structures. Insulating layer 8 can present a certain mechanical strength to secure nanotubes 6 or the structure whereon layer 8 is deposited.

Depending on the deposition conditions of insulating layer 8, nanotubes 6 can then present a free end or not, i.e. an end not coated by insulating layer 8. In the case where most of nanotubes 6 do not pass completely through insulating layer 8, and additional step (not represented) is required to free the top end of nanotubes 6. Most of the nanotubes then pass through insulating layer 8 and constitute passages between target layer 3 or bottom conducting layer 2 and the outside. This additional step is performed by any known means and can for example be comprised of chemical mechanical polishing, plasma etching or wet etching, which specifically eliminates insulating layer 8.

Insulating layer 8 is preferably sufficiently rigid (sufficiently dense and with a suitable Young's modulus) so as not to deform, or to deform very little, once the air gaps are formed in target layer 3. Support elements (not shown) are advantageously integrated in the structure to increase the mechanical strength. Insulating layer 8 is likewise chosen in such a way as not to be etched during the decomposition process of decomposable material 4. Layer 8 is preferably impervious to the chemical etching agent used to decompose material 5 and to the decomposition by-products. Insulating layer 8 is advantageously made from dielectric material and even more advantageously from low-k dielectric material (about 2 to 5). This insulating layer 8 has a thickness typically in the 20-500 nm range.

Insulating layer 8 is advantageously of Methylsilsesquioxane type and is more particularly made from BD1® material marketed by Applied Materials.

The device thus formed is subjected to decomposition agents of decomposable material 4. This decomposition can be performed using any known method, for example a thermal method, by radiation (for example ultraviolet radiation) or by any suitable ondulatory phenomenon or by chemical etching by an agent in liquid or gaseous form.

Figure 3:
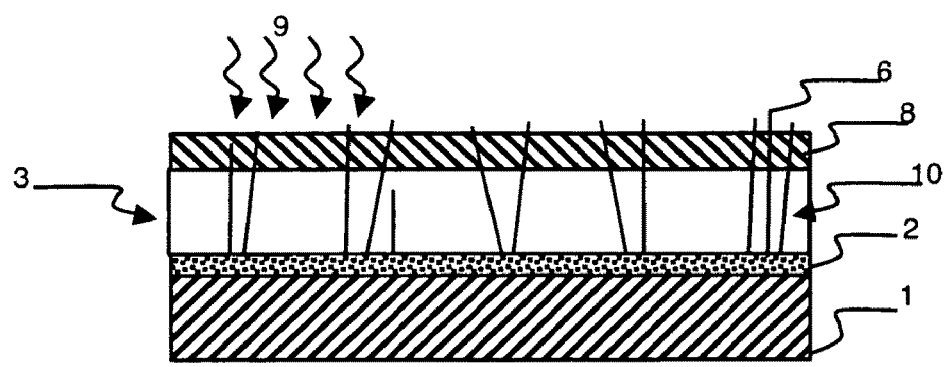

As illustrated in FIG. 3, in the case of chemical etching by an agent 9 in liquid form, the agent can for example be disposed in the form of a solution on insulating layer 8. The agent can then pass through insulating layer 8, through nanotubes 6, and then by passing through the porous walls of the nanotubes, can reach holes 5 and decompose sacrificial material 4. Agent 9 can also pass through insulating layer 8 along the outside walls of nanotubes 6 in the case where the latter are not perfectly joined with encapsulation layer 8. The nanotubes, having walls that are porous to the chemical agents and to the reaction by-products, thus form passages for the liquid or gas between target layer 3 and the outside. Formation of nanotubes designed to act as passage for a gas or a liquid in the field of biology has in particular been described in the article "Enhanced flow in carbon nanotubes" Nature, 438 (2005), p. 44. However this article does not mention the fluid losses due to the porosity of the side walls and the losses along the walls.

The characteristic features of nanotubes 6, in particular their diameter, are defined in the case of chemical etching such as to enable an agent able to decompose decomposable material 4 to pass through them. If a thermal or ondulatory decomposition method of decomposable material 4 is used, nanotubes 6 are not used by the decomposition agent. However, in all cases, the characteristics of nanotubes 6 must be chosen such as to enable the by-products of decomposition of decomposable material 4 to be eliminated to the outside by means of the nanotubes (porous walls and central holes of the nanotubes).

Formation of passages constituted by nanotubes 6 between target layer 3 and the outside, within insulating layer 8, thus enables an agent 9, for example a chemical agent, to reach and decompose decomposable material 4 and, after decomposition of material 4, enables the decomposition residues to be eliminated through insulating layer 8 to create or enlarge air gaps 10 adjacent to the nanotubes passing through target layer 3, as illustrated in FIG. 3.

Chemical decomposition agent 9 coming from outside thereby enters the hollow nanotube 6, passes through insulating layer 8 and then passes through the walls of the nanotube and/or passes along the outside walls of the nanotubes to reach decomposable material 4 of target layer 3. In similar manner, after selective decomposition of decomposable material 4, the decomposition by-product formed follows the same path in the reverse direction.

Decomposition and elimination of material 4 is preferably total. As illustrated in FIG. 3, air gaps 10 thus formed within target layer 3 then totally replace decomposable material 4 which thus constitutes a sacrificial material.

When nanotubes 6 are carbon nanotubes, diffusion of decomposition agent and/or of decomposition by-products by means of the nanotubes is performed by means of the nanotube walls, of the nanotube/insulating layer interface and of the hollow channel of nanotube 6. Nanotubes 6 can also be made of titanium oxide, gallium nitride or a rare earth compound base.

Advantageously, if completely hollow nanotubes 6 are to be obtained by catalytic means, the catalyst grains used for their formation can be eliminated for example by means of an acid solution (for example of nitric acid $HNO_3$).

The diameter of nanotubes 6, typically between 1 nm and 300 nm, is chosen according to the required application and according to the decomposition method of the by-products resulting therefrom. In fact the broader nanotube 6 is, the easier diffusion of chemical species (agent 9) is. Likewise, the decomposition by-products are liable to be removed much more quickly if nanotube 6 is broad.

If very localized etching is required, the use of fine nanotubes 6 and of suitable decomposition processes (relatively short etching or annealing time) will be preferred. If on the contrary broad gaps are required around nanotubes 6, broad nanotubes 6 will then be fabricated, possibly with a very concentrated chemical decomposition agent 9, or a longer etching time will be used. The person skilled in the art will adapt the etching time to the concentration of the chemical etching solution.

The density of nanotubes 6 is also chosen according to the required application. This density of nanotubes 6 is preferably about $10^{10}$ nanotubes/cm$^2$. With a nanotube density of this order, diffusion of the decomposition agent is easy as is removal of the decomposition by-products. Such a nanotube density moreover helps the mechanical strength of the structure as a whole and facilitates the formation of additional interconnect levels if applicable.

In the case where decomposable material 4 is formed by silicon oxide, its decomposition can be achieved by means of hydrofluoric acid. The material of layer 8 is then chosen such as not to react with hydrofluoric acid, and layer 8 is then for example made from silicon nitride or from silicon carbide or from SiOC.

Figure 4:
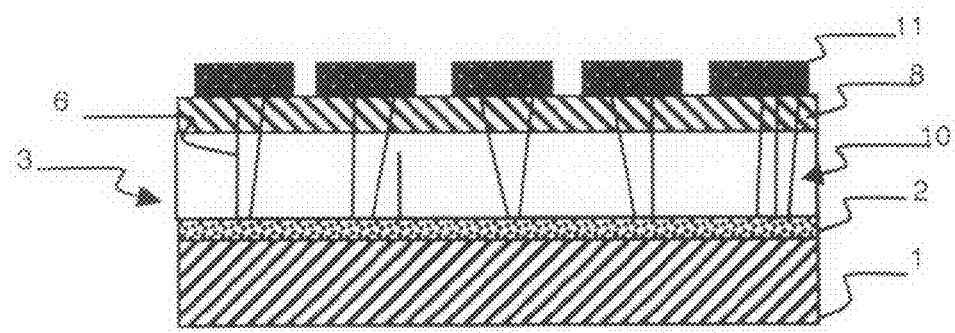

As illustrated in FIG. 4, decomposable material 4 being at least partially eliminated, a top conducting layer 11 is then deposited and patterned so as to connect the top end of nanotubes 6 opening out from insulating layer 8. An electric connection between conducting layer 2 and the patterns of top conducting layer 11, advantageously made of metallic material, is thus made by means of nanotubes 6. In conventional manner, one or more interconnect levels can be made from top conducting layer 11. At this moment, it is no longer possible to use nanotubes 6 as diffusion path of a decomposition agent 9 or of a decomposition by-product.

Figure 5:
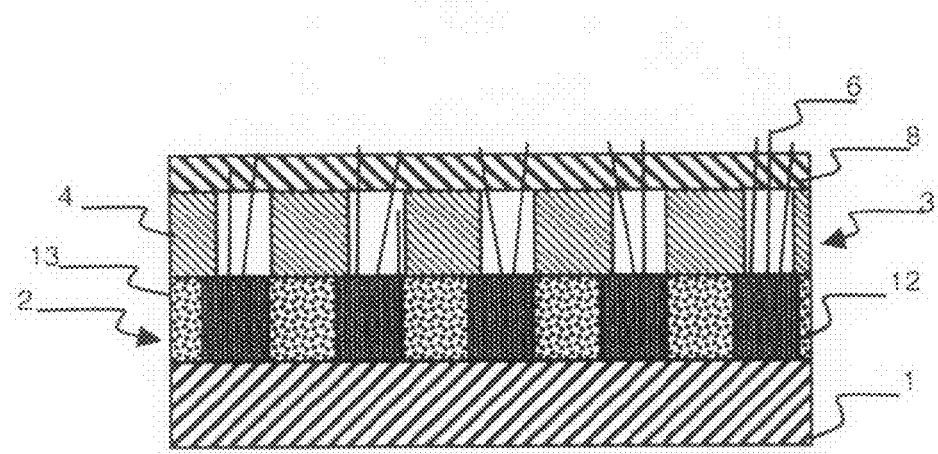
FIGS. 5 and 6 represent the successive steps of a second embodiment of the method according to the invention.

In a second embodiment illustrated in FIG. 5, bottom conducting layer 2 is formed by a first interconnect level formed by patterns (for example contact pads or lines) made from electrically conducting material 12 and from insulating material 13.

Figure 6:
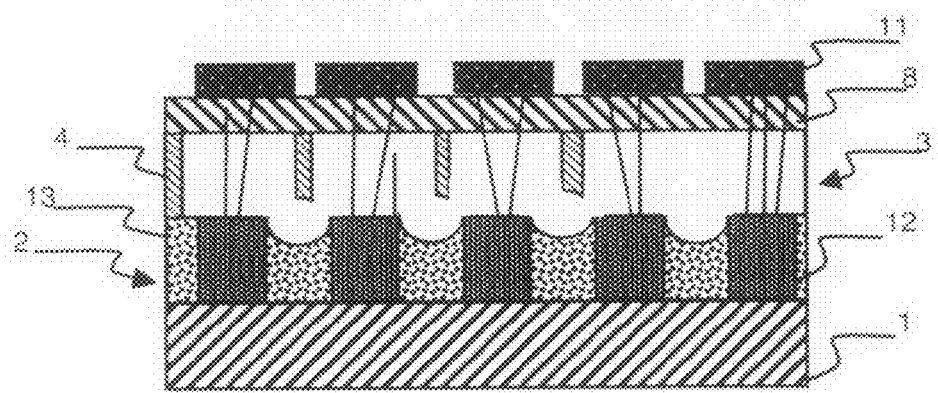

As before, to integrate air gaps in this metallic interconnect structure, target layer 3 can be formed solely by a decomposable material 4, for example silicon oxide. Electrically conducting material 12 of bottom conducting layer 2 is for example metallic (for example copper), whereas insulating material 13 is identical to decomposable material 4. In this way, when action of the decomposition agent takes place, materials 4 and 13 will be at least partially eliminated (FIG. 6).

In an alternative embodiment, material 4 is thermally decomposable, the other materials being able to remain unchanged. Decomposable material 4 is then for example of polymer type (for example made from polymethylmethacrylate PMMA, of pore-forming type from Norbornadiene or alpha-terpinene . . . ). In this approach, the structure is then heated so as to achieve thermal decomposition of decomposable material 4. As before, the decomposition by-products can then diffuse out from target layer 3 by means of nanotubes 6, the walls and central holes of which act as passages.

Figure 7:
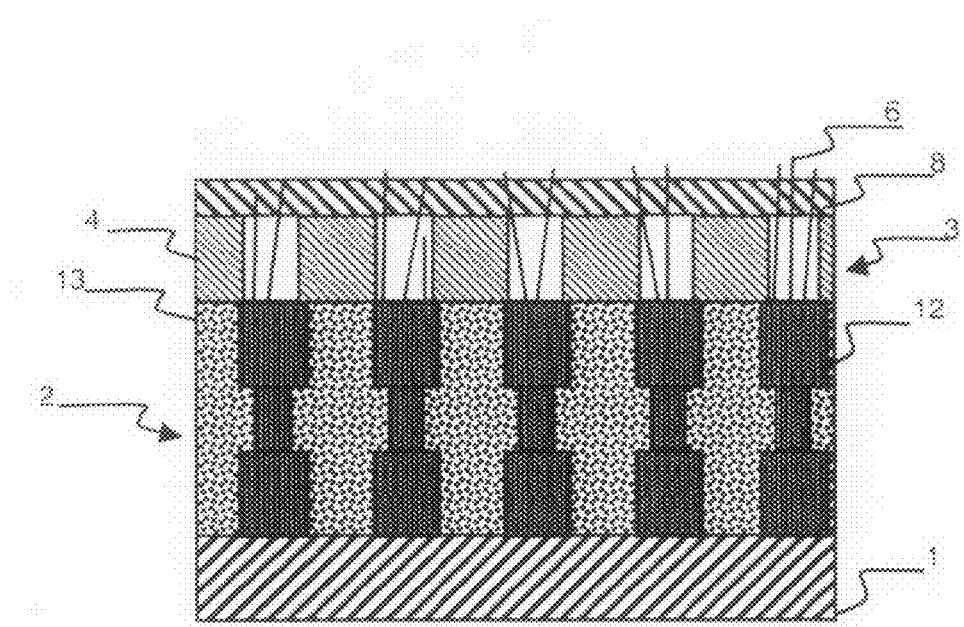
FIGS. 7 and 8 represent various steps of a third embodiment of the method according to the invention.

In a third embodiment illustrated in FIG. 7, bottom conducting layer 2 comprises several superposed interconnect levels formed by patterns (for example contact pads or lines) made from preferably metallic electrically conducting material 12, for example copper, in a matrix made of insulating material 13 that is preferably decomposable. This integration can be performed by any known technique, for example by the damascene technique.

Figure 8:
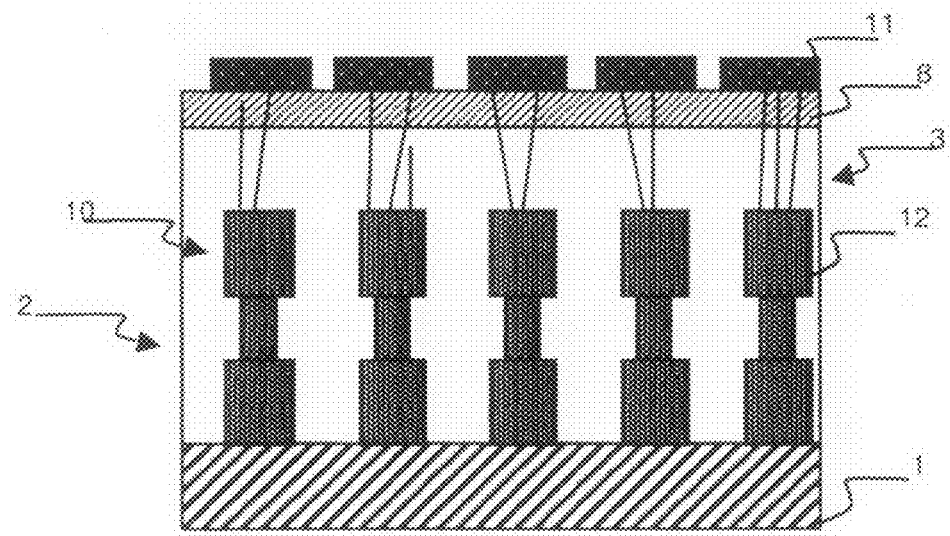

In this embodiment, the substrate then comprises a plurality of interconnect levels comprising patterns of metallic material in a matrix of decomposable material. Holes 5 in target layer 3 have advantageously been located facing the patterns of material 12 so as to enable growth of nanotubes 6 from the metallic material patterns of layer 2. As before, removal of decomposable material from the various interconnect levels is then performed through the walls and central holes of nanotubes and a structure with air gaps is easily obtained (FIG. 8).

As in FIG. 4, when the air gaps have been formed in target layer 3, top conducting layer 11 is deposited. Top conducting layer 11 is then in electric contact with bottom conducting layer 2 or the various interconnect levels by means of nanotubes 6.

The invention claimed is:

1. A fabrication method of a nanotube-based electric connection between first conducting layer and a second conducting layer separated by a target layer, the method successively comprising:
    forming the target layer on the first conducting layer,
    forming in the target layer one hole comprising a bottom made by the first conducting layer,
    growing nanotubes in the hole so as to be in electrical contact with the first conducting layer, the nanotubes comprising porous walls,
    depositing a flat insulating layer through which the nanotubes pass,
    decomposing selectively the target layer, made of a decomposable material, the porous walls forming passages between the target layer and an inner part of the nanotubes for a decomposition agent and/or decomposition by-products formed during the selective decomposition, and
    forming the second conducting layer so as to be electrically connected to the first conducting layer by the nanotubes.

2. The method according to claim 1, comprising forming a catalyst layer in the bottom of the hole before growing the nanotubes.

3. The method according to claim 1, wherein the decomposing selectively the target layer is performed by chemical etching by means of the nanotubes, the insulating layer being impervious to the chemical agent, the chemical agent and the decomposition by-products being conveyed through the walls of the nanotubes and/or along the walls of the nanotubes.

4. The method according to claim 1, wherein the decomposing selectively the target layer is performed by a thermal process, the decomposition by-products being conveyed through the walls of the nanotubes and/or along the walls of the nanotubes.

5. The method according to claim 1, wherein the decomposing selectively the target layer is performed by radiation, the decomposition by-products being conveyed through the walls of the nanotubes and/or along the walls of the nanotubes.

6. The method according to claim 1, wherein the target layer is made from silicon oxide, and the decomposing the target layer is performed by means of hydrofluoric acid.

7. The method according to claim 1, wherein the nanotubes are carbon nanotubes.

8. The method according to claim 1, wherein the first conducting layer is formed by a metallic interconnect level comprising patterns made from a decomposable insulating material and an electrically conducting material, and the decomposing selectively the target layer eliminates the insulating material patterns.

9. The method according to claim 1, wherein the first conducting layer is formed by a metallic interconnect level comprising patterns made from an insulating material and an electrically conducting material, and the holes are formed in the target layer facing the patterns made of the electrically conducting material.

10. The method according to claim 9, wherein the first conducting layer comprises several superposed metallic interconnect levels.

* * * * *